(12) United States Patent
Rajagopalan et al.

(10) Patent No.: US 8,078,415 B2
(45) Date of Patent: Dec. 13, 2011

(54) METHOD AND APPARATUS TO MONITOR STATE OF HEALTH OF ELECTRICAL CONNECTIONS BETWEEN BATTERY AND GENERATOR

(75) Inventors: Satish Rajagopalan, Knoxville, TN (US); Yilu Zhang, Northville, MI (US); Mutasim A. Salman, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 254 days.

(21) Appl. No.: 12/626,540

(22) Filed: Nov. 25, 2009

(65) Prior Publication Data

US 2011/0125430 A1    May 26, 2011

(51) Int. Cl.
*G01R 33/00* (2006.01)
(52) U.S. Cl. .......................................... 702/58
(58) Field of Classification Search ............. 702/58, 702/59

See application file for complete search history.

(56) References Cited

U.S. PATENT DOCUMENTS 7,282,811 B2 * 10/2007 Niska et al. ................. 307/10.7

OTHER PUBLICATIONS

W. G. Zanardelli, E. G. Strangas, and S. Aviyente, "Identification of Intermittent Electrical and Mechanical Faults in Permanent-Magnet AC Drives Based on Time-Frequency Analysis," Industry Applications, IEEE Transactions on, vol. 43, pp. 971-980, 2007.

* cited by examiner

*Primary Examiner* — Drew A Dunn
*Assistant Examiner* — Stephen Cherry
(74) *Attorney, Agent, or Firm* — John A. Miller; Miller IP Group, PLC

(57) ABSTRACT

A system and method for monitoring the state of health of the connection between a generator and a battery includes detecting an interruption in power between the generator and the battery, incrementing a counter each time an interruption is detected, generating a trend of a number of interruptions over time based on a number of increments in the counter, monitoring a rate of increase in the number of interruptions over time and determining if the rate of increase in the number of interruptions over time is greater than a predetermined threshold.

20 Claims, 3 Drawing Sheets

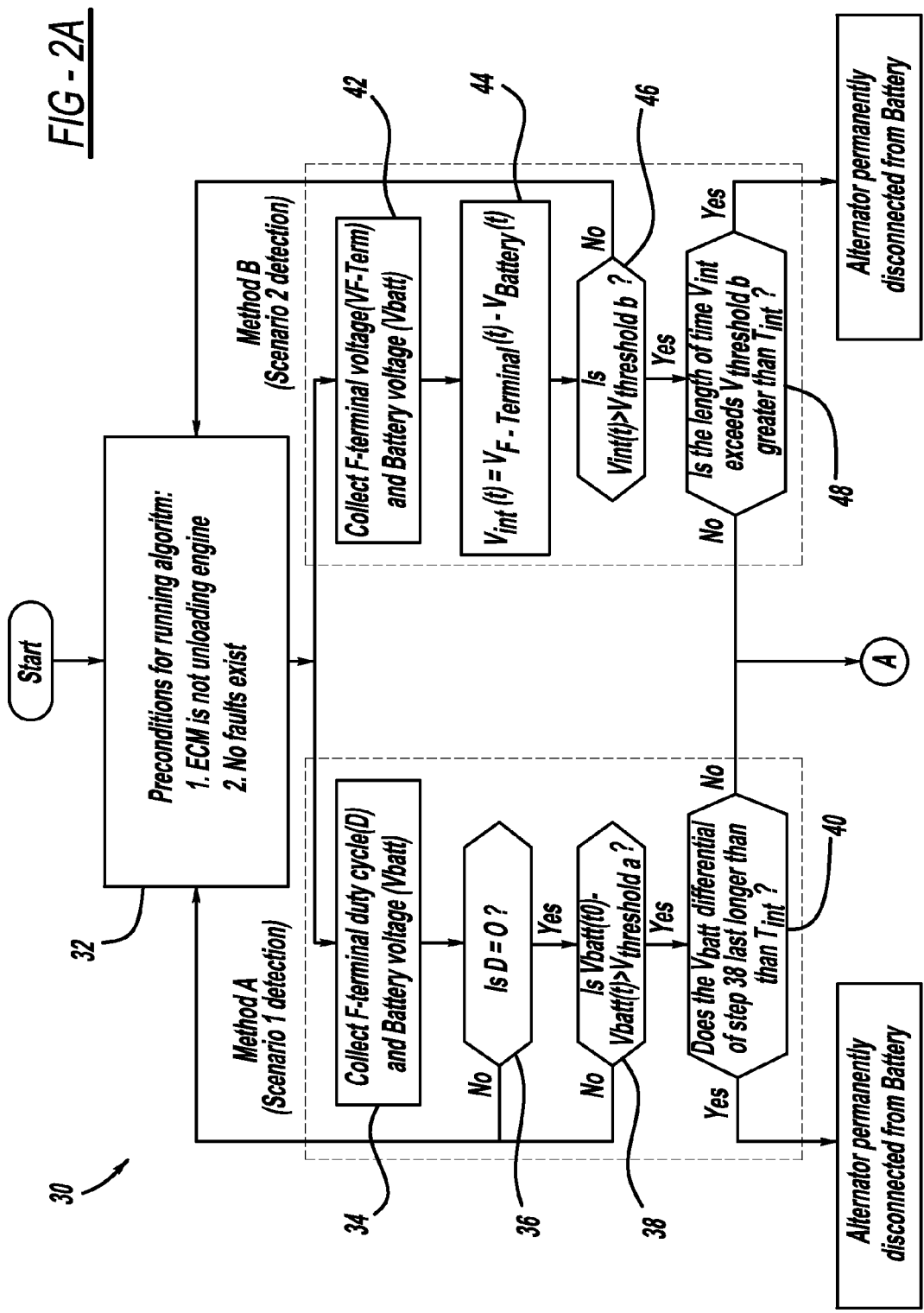

METHOD AND APPARATUS TO MONITOR STATE OF HEALTH OF ELECTRICAL CONNECTIONS BETWEEN BATTERY AND GENERATOR

BACKGROUND

1. Field of the Invention

This invention relates generally to monitoring the state of health of electrical connections and, more particularly, to detecting and prognosing electrical interconnection problems between an alternator and a battery.

2. Discussion of the Related Art

There is a constant effort in the automotive industry to improve the quality and reliability of vehicles by incorporating fault diagnosis and prognosis features into vehicles. Certain conditions, however, are more difficult to diagnose and predict than others, especially when the problems are intermittent. For example, the connections between a battery and an alternator are characteristically difficult to effectively monitor due to loosening connectors and/or corrosion that can cause anomalies to appear sporadically.

In addition, known techniques for monitoring the health of a battery or alternator are generally only capable of detecting a complete disconnection between the battery and alternator, not an intermittent or failing connection. Moreover, these techniques usually employ sophisticated signaling schemes that require additional hardware and that are difficult to implement on a vehicle due to the limited computational capacity of a vehicle's control unit.

Therefore, what is needed is a system and method for monitoring the state of health of the wiring between the battery and the alternator without adding additional hardware to the system.

SUMMARY

A system and method for monitoring the state of health of the connection between a generator and a battery includes detecting an interruption in power between the generator and the battery, incrementing a counter each time an interruption is detected, generating a trend of a number of interruptions over time based on a number of increments in the counter, monitoring a rate of increase in the number of interruptions over time and determining if the rate of increase in the number of interruptions over time is greater than a predetermined threshold.

Additional features of the present invention will become apparent from the following description and appended claims, taken in conjunction with the accompanying drawings.

BRIEF DESCRIPTION OF THE DRAWINGS

FIGS. 2A and 2B are flow charts illustrating an exemplary algorithm for monitoring the health of the connections between a battery and an alternator, according to an embodiment.

DETAILED DESCRIPTION OF THE EMBODIMENTS

The following discussion of the embodiments of the invention are directed a system and method for monitoring the health of the connections between a battery and a generator, such as an alternator. The aforementioned embodiments are merely exemplary in nature, and are in no way intended to limit the invention, its applications or uses.

Figure 1:
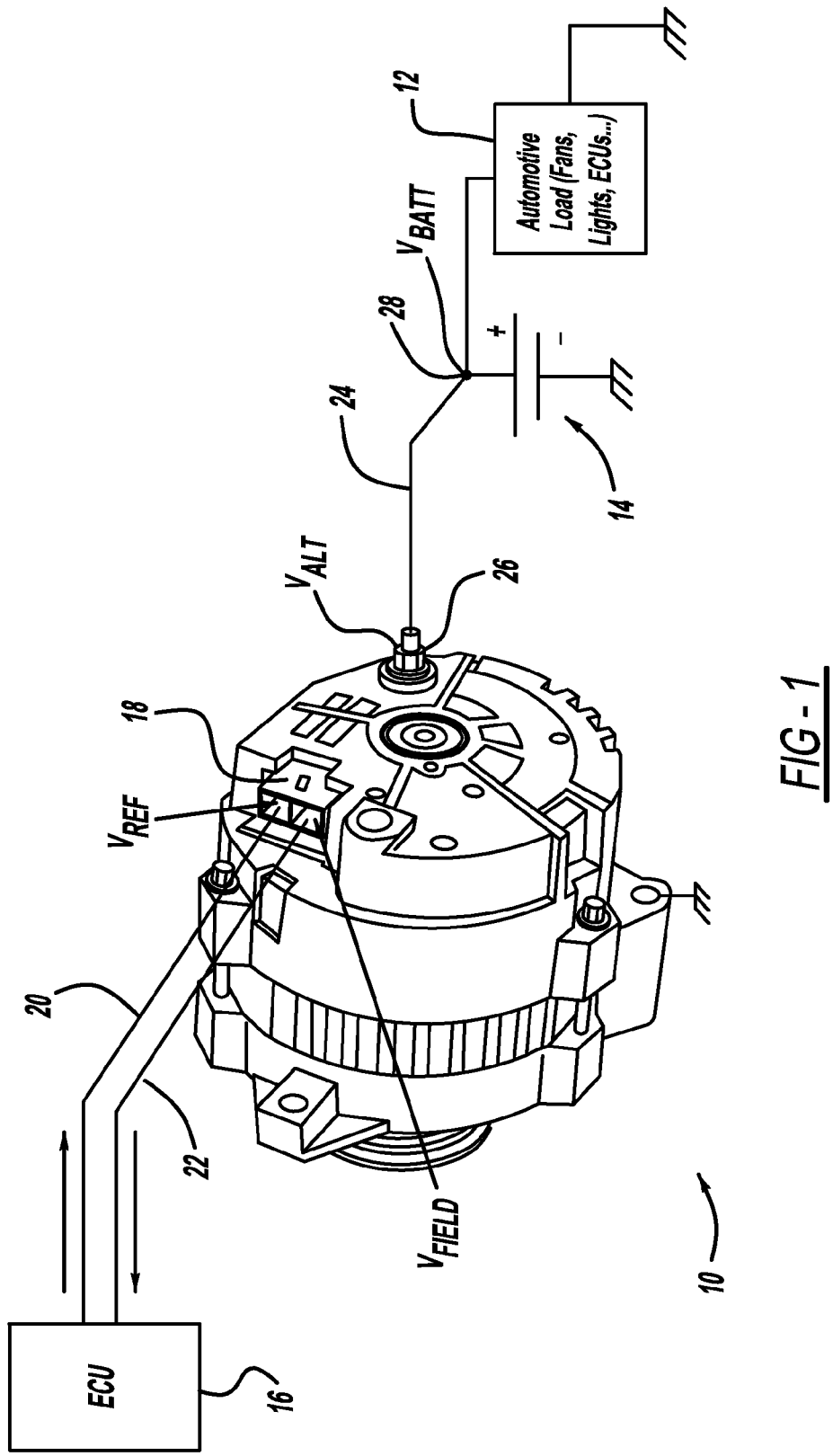
FIG. 1 illustrates an exemplary connection diagram for a vehicle alternator, according to one embodiment.

FIG. 1 illustrates an exemplary connection diagram for a vehicle alternator 10. The alternator 10 is connected to an automotive load 12 through a battery 14. The automotive load 12 may include, for example, fans, lights and electronic control units (ECUs), to name a few. In one embodiment, the alternator 10 is connected to an ECU 16 through a two-pin control interface connector 18 mounted on the alternator 10. The ECU 16 and the alternator 10 are connected by two control wires 20, 22 that terminate at the control interface connector 18 mounted on the alternator 10. The first wire 20 provides a signal that sets the reference voltage $V_{REF}$ for the output of the alternator 10. The second wire 22 provides a signal to the ECU 16 that replicates the field voltage $V_{FIELD}$ of the alternator 10 and is used by the ECU 16 to estimate the load 12. In general, the field voltage $V_{FIELD}$ is a pulse width modulated voltage that swings between an alternator output voltage $V_{ALT}$ and ground.

The wiring (e.g., cable, etc.) 24 between the battery 14 and the alternator 10 is the primary connection monitored by the algorithm discussed herein. At one end 26, the wire 24 terminates at the alternator 10 where the alternator output voltage $V_{ALT}$ is measured. At the other end 28, the wire 24 terminates on the battery 14 where the battery voltage $V_{BATT}$ is measured. Although a break or disconnection may occur anywhere along wire 24, the ends 26, 28 of the wire are where electrical disconnection, loosening connectors and/or contact resistance can increase due to corrosion.

The algorithm, discussed in detail below, is configured to monitor the health of wire 24 given two primary scenarios that describe the system behavior when an intermittent electrical connection causes an overvoltage condition on the alternator output terminal 26. There are three measured quantities that are used to implement this algorithm, the field voltage $V_{FIELD}$, the battery voltage $V_{BATT}$ and the field voltage $V_{FIELD}$ duty cycle. Each of these quantities is already measured by existing sensors and hardware. Thus, the implementation of the monitoring system and method disclosed herein requires no additional equipment.

The first scenario arises when the connection problem is severe enough to trigger an existing overvoltage protection scheme. Once triggered, the overvoltage protection causes the field voltage $V_{FIELD}$ duty cycle to approach or become zero and the voltage measured at the battery $V_{BATT}$ to drop from the nominal alternator output voltage $V_{ALT}$, which is generally around 14 volts, to the actual battery voltage $V_{BATT}$, which approximately 12.5 volts.

In the second scenario, the connection problem is not as severe and therefore does not trigger any overvoltage protection scheme. Instead, under these circumstances, the field voltage $V_{FIELD}$ duty cycle does not approach or become zero and the peak of the field voltage $V_{FIELD}$, which is the actual alternator output voltage $V_{ALT}$, is different from the battery voltage $V_{BATT}$. This scenario also applies to high impedance connections due to corroded contacts.

FIG. 2A is a flow chart illustrating an exemplary algorithm 30 for monitoring the state of health of the connections between the battery 14 and the alternator 10. Prior to initiating the algorithm, at step 32 certain preconditions are examined. In one embodiment, the preconditions include verifying that the vehicle's electronic control module is not unloading the engine and that there are no existing faults associated with either the reference voltage $V_{REF}$ terminal or the field voltage $V_{FIELD}$ terminal. If the preconditions are satisfied, algorithm 30 simultaneously detects conditions associated with each of the two scenarios discussed above. However, for ease of explanation, the methods for detecting conditions associated with each of the two scenarios will be discussed consecutively.

To detect the first scenario in which an overvoltage scheme is triggered, at step 34 the field voltage $V_{FIELD}$ duty cycle and the battery voltage $V_{BATT}$ are collected. At step 36, algorithm 30 determines whether the field voltage $V_{FIELD}$ duty cycle is less than a predetermined threshold, which is most cases, will be close to zero. If the field voltage $V_{FIELD}$ duty cycle is not less than the threshold, the algorithm returns to the precondition stage at step 32. If the field voltage $V_{FIELD}$ duty cycle is less than the threshold, algorithm 30 determines at steps 38 and 40, respectively, whether there was a significant change in the battery voltage $V_{BATT}$ and how long the change lasted. Thus, at step 38 algorithm 30 determines if the battery voltage $V_{BATT}$ at time=0 minus the battery voltage $V_{BATT}$ at time=$t_1$ is greater than a first voltage threshold $V_{THRESHOLDa}$. If the difference in the battery voltage $V_{BATT}$ between the designated time period (i.e., t=0 to t=$t_1$) is not greater than $V_{THRESHOLDa}$, the algorithm returns to the precondition stage at step 32. If the difference in battery voltage $V_{BATT}$ is greater than $V_{THRESHOLDa}$, the algorithm 30 determines at step 40 if the time period for which there is a battery voltage $V_{BATT}$ differential exceeds a predetermined time interval $T_{INT}$. If the battery voltage $V_{BATT}$ differential exceeds $V_{THRESHOLDa}$ for longer than time interval $T_{INT}$, then the alternator 10 has been completely disconnected from the battery 14. Otherwise, if the battery voltage $V_{BATT}$ differential has exceeded $V_{THRESHOLDa}$ but not for longer than time interval $T_{INT}$, the problem is intermittent and the algorithm will proceed to from the detection stage to an evaluation stage, which will be described in detail below.

To detect the second scenario in which the problem is not severe enough to trigger an overprotection scheme, algorithm 30 collects the field voltage $V_{FIELD}$ and the battery voltage $V_{BATT}$ at step 42. At step 44, the battery voltage $V_{BATT}$ is subtracted from the field voltage $V_{FIELD}$ to determine a voltage interrupt $V_{INT}$. At step 46, algorithm 30 determines if the voltage interrupt $V_{INT}$ at time t is greater than a second voltage threshold $V_{THRESHOLDb}$. If not, the algorithm returns to the precondition stage at step 32. If yes, algorithm 30 determines at step 48 if the length of time the voltage interrupt $V_{INT}$ is greater than voltage threshold $V_{THRESHOLDb}$ exceeds a predetermined time interval $T_{INT}$. If the time interval $T_{INT}$ is exceeded, then the alternator 10 has been completely disconnected from the battery 14. However, if the length of time the voltage interrupt $V_{INT}$ is greater than voltage threshold $V_{THRESHOLDb}$ does not exceed time interval $T_{INT}$, the problem is intermittent and the algorithm will proceed to from the detection stage to an evaluation stage, which will be described in detail below.

Figure 2B:
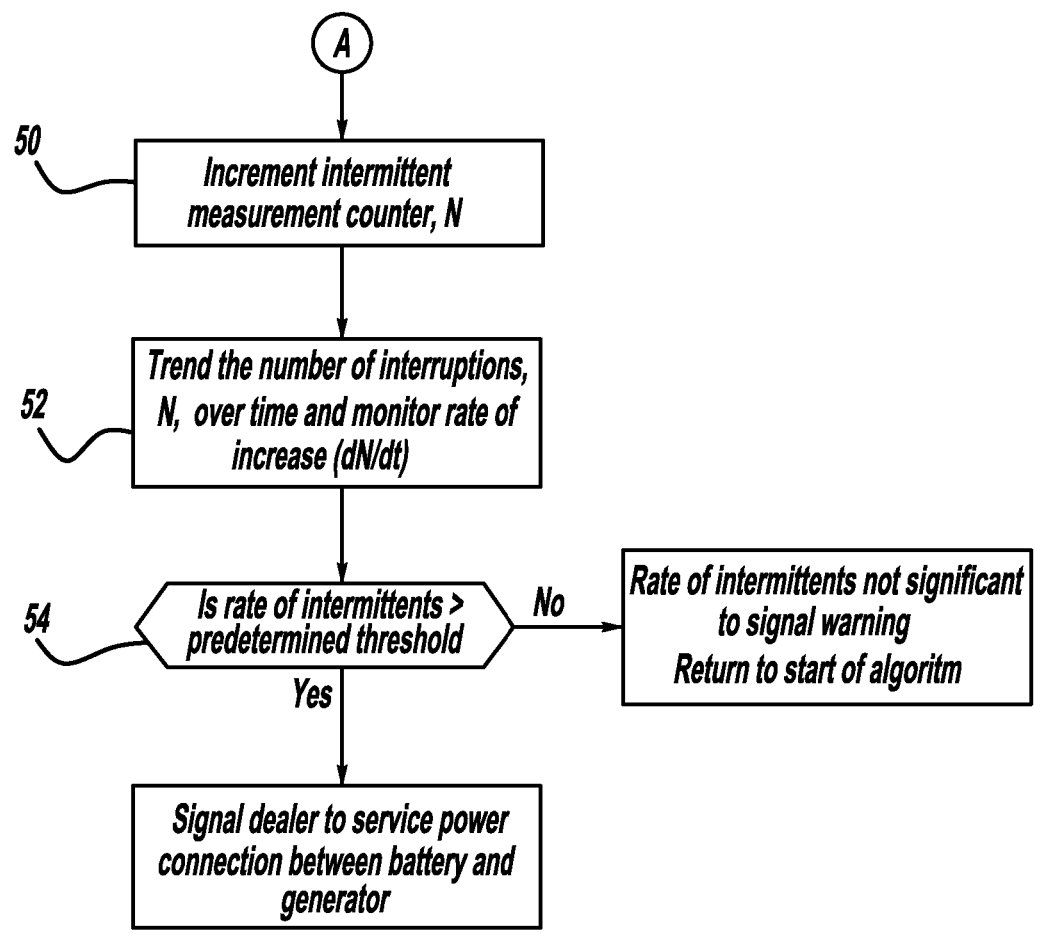

FIG. 2B is a flow chart illustrating the evaluation stage of algorithm 30. The evaluation stage begins at step 50 where an intermittent measurement counter N is incremented by at least one negative condition at either steps 40 and 48. In other words, if one or both of the conditions at steps 40 or 48 are not satisfied, counter N is incremented by one.

Next, at step 52 the number of interruptions and the rate of increase (dN/dt) for those interruptions is monitored and a trend over time is generated for the number of interruptions in accumulated in counter N. At step 54 algorithm 30 determines if the rate of increase of interruptions is greater than a predetermined threshold. If no, then the rate of intermittent interruptions is not yet considered significant enough to signal a warning and the algorithm returns to the precondition stage at step 32. However, if the rate of intermittent events is beyond a predetermined threshold, a severe problem may be developing in the connection between the alternator 10 and the battery 14 and a warning is signaled. The signaling of a warning could be to the vehicle operator through an on-board flexible computing system such as OnStar™ or to a dealer.

The system described herein may be implemented on one or more suitable computing devices, which generally include applications that may be software applications tangibly embodied as a set of computer-executable instructions on a computer readable medium within the computing device. The computing device may be any one of a number of computing devices, such as a personal computer, processor, handheld computing device, etc.

Computing devices generally each include instructions executable by one or more devices such as those listed above. Computer-executable instructions may be compiled or interpreted from computer programs created using a variety of programming languages and/or technologies, including without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of known computer-readable media.

A computer-readable media includes any medium that participates in providing data (e.g., instructions), which may be read by a computing device such as a computer. Such a medium may take many forms, including, but not limited to, non-volatile media, volatile media, and transmission media. Non-volatile media includes, for example, optical or magnetic disks and other persistent memory. Volatile media include dynamic random access memory (DRAM), which typically constitutes a main memory. Common forms of computer-readable media include any medium from which a computer can read.

It is to be understood that the above description is intended to be illustrative and not restrictive. Many alternative approaches or applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that further developments will occur in the arts discussed herein, and that the disclosed systems and methods will be incorporated into such further examples. In sum, it should be understood that the invention is capable of modification and variation and is limited only by the following claims.

The present embodiments have been particular shown and described, which are merely illustrative of the best modes. It should be understood by those skilled in the art that various alternatives to the embodiments described herein may be employed in practicing the claims without departing from the spirit and scope of the invention and that the method and system within the scope of these claims and their equivalents be covered thereby. This description should be understood to include all novel and non-obvious combinations of elements described herein, and claims may be presented in this or a later application to any novel and non-obvious combination of these elements. Moreover, the foregoing embodiments are illustrative, and no single feature or element is essential to all possible combinations that may be claimed in this or a later application.

All terms used in the claims are intended to be given their broadest reasonable construction and their ordinary meaning as understood by those skilled in the art unless an explicit indication to the contrary is made herein. In particular, use of the singular articles such as "a", "the", "said", etc. should be read to recite one or more of the indicated elements unless a claim recites an explicit limitation to the contrary.

What is claimed is:

1. A method for monitoring the state of health of the connection between a generator and a battery, the method comprising:
    detecting an interruption in power between the generator and the battery;
    incrementing a counter each time an interruption is detected;
    generating a trend of a number of interruptions over time based on a number of increments in the counter;
    monitoring a rate of increase in the number of interruptions over time; and
    determining if the rate of increase in the number of interruptions over time is greater than a predetermined threshold.

2. The method of claim 1, wherein the generator is an alternator.

3. The method of claim 1, transmitting a warning signal if the rate of increase in the number of interruptions over time is greater than the predetermined threshold.

4. The method of claim 1, wherein detecting an interruption in power includes monitoring the behavior of the generator and battery when an intermittent electrical connection causes an overvoltage condition.

5. The method of claim 1, wherein detecting an interruption in power includes monitoring a duty cycle of a voltage at the generator and a voltage at the battery when an intermittent electrical connection causes an overvoltage condition at a generator output terminal.

6. The method of claim 5, wherein detecting an interruption in power further includes determining if the duty cycle is below a predetermined duty cycle threshold.

7. The method of claim 6, wherein if the duty cycle is below the predetermined duty cycle threshold, detecting an interruption in power further includes determining if a decrease in battery voltage for a given time period is greater than a first predetermined voltage threshold.

8. The method of claim 7, wherein if the decrease in battery voltage for the given time period is greater than the first predetermined voltage threshold, detecting an interruption in power further includes determining whether a time period in which there is a decrease in battery voltage exceeds a first predetermined time threshold.

9. The method of claim 1, wherein detecting an interruption in power includes monitoring a voltage at the generator and a voltage at the battery when an intermittent electrical connection does not cause an overvoltage condition at a generator output terminal.

10. The method of claim 9, wherein detecting an interruption in power includes calculating the difference between the voltage at the generator and the voltage at the battery, and determining if the difference in voltage between the generator and battery is greater than a second predetermined voltage threshold.

11. The method of claim 10, wherein if the voltage between the generator and battery is greater than the second predetermined voltage threshold, detecting an interruption in power further includes determining whether a time period in which the voltage difference is greater than the second predetermined voltage threshold exceeds a second predetermined time threshold.

12. A system that includes non-transitory computer-readable medium tangibly embodying computer-executable instructions for:
    detecting an interruption in power between the generator and the battery;
    incrementing a counter each time an interruption is detected;
    generating a trend of a number of interruptions over time based on a number of increments in the counter;
    monitoring a rate of increase in the number of interruptions over time;
    determining if the rate of increase in the number of interruptions over time is greater than a predetermined threshold; and
    transmitting a warning signal if the rate of increase in the number of interruptions over time is greater than the predetermined threshold.

13. The system of claim 12, wherein detecting an interruption in power includes monitoring the behavior of the generator and battery when an intermittent electrical connection causes an overvoltage condition.

14. The system of claim 12, wherein detecting an interruption in power includes monitoring a duty cycle of a voltage at the generator and a voltage at the battery when an intermittent electrical connection causes an overvoltage condition at a generator output terminal.

15. The system of claim 14, wherein detecting an interruption in power further includes determining if the duty cycle is below a predetermined duty cycle threshold.

16. The system of claim 15, wherein if the duty cycle is below the predetermined duty cycle threshold, detecting an interruption in power further includes determining if a decrease in battery voltage for a given time period is greater than a first predetermined voltage threshold.

17. The system of claim 16, wherein if the decrease in battery voltage for the given time period is greater than the first predetermined voltage threshold, detecting an interruption in power further includes determining whether a time period in which there is a decrease in battery voltage exceeds a first predetermined time threshold.

18. The system of claim 12, wherein detecting an interruption in power includes monitoring a voltage at the generator and a voltage at the battery when an intermittent electrical connection does not cause an overvoltage condition at a generator output terminal.

19. The system of claim 18, wherein detecting an interruption in power includes calculating the difference between the voltage at the generator and the voltage at the battery, and determining if the difference in voltage between the generator and battery is greater than a second predetermined voltage threshold.

20. The system of claim 19, wherein if the voltage between the generator and battery is greater than the second predetermined voltage threshold, detecting an interruption in power further includes determining whether a time period in which the voltage difference is greater than the second predetermined voltage threshold exceeds a second predetermined time threshold.

* * * * *